(12) United States Patent
Freytag

(10) Patent No.: US 7,514,922 B2
(45) Date of Patent: Apr. 7, 2009

(54) VACUUM CONTAINER FOR COOLED MAGNETIC RESONANCE PROBE HEAD

(75) Inventor: Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 24 days.

(21) Appl. No.: 11/898,227

(22) Filed: Sep. 11, 2007

(65) Prior Publication Data
US 2008/0084211 A1    Apr. 10, 2008

(30) Foreign Application Priority Data
Oct. 4, 2006    (DE)    ............ 10 2006 046 888

(51) Int. Cl.
*G01V 3/00*    (2006.01)
(52) U.S. Cl. ............... 324/307; 324/310
(58) Field of Classification Search ......... 324/300–322; 600/410–435; 335/296–306; 333/219–235; 343/824, 872; 62/45.1, 51.1–53.1, 100, 159, 62/169, 268, 331, 440–449, 451–452
See application file for complete search history.

(56) References Cited

U.S. PATENT DOCUMENTS

| | | | |
|---|---|---|---|
| 3,525,928 A | 8/1970 | Kunihiko | |
| 5,247,256 A | 9/1993 | Marek | |
| 5,258,710 A | 11/1993 | Black | |
| 5,508,613 A | 4/1996 | Kotsubo | |
| 5,585,723 A | 12/1996 | Withers | |
| 6,437,570 B2* | 8/2002 | Marek | .......... 324/321 |
| 6,441,617 B2* | 8/2002 | Marek | .......... 324/318 |
| 6,466,019 B2* | 10/2002 | Marek | .......... 324/318 |
| 6,727,700 B2 | 4/2004 | Marek | |
| 6,833,701 B2* | 12/2004 | Marek | .......... 324/307 |
| 6,838,880 B2 | 1/2005 | Hofmann | |
| 6,914,430 B2 | 7/2005 | Hasegawa | |
| 2003/0206020 A1 | 11/2003 | Cohen | |
| 2004/0004478 A1 | 1/2004 | Hofmann | |
| 2004/0108852 A1 | 6/2004 | Thomas | |
| 2005/0077900 A1 | 4/2005 | de Swiet | |

FOREIGN PATENT DOCUMENTS

| | | |
|---|---|---|
| DE | 19 12 604 | 9/1970 |
| EP | 0 461 493 | 12/1991 |
| EP | 1 251 361 | 10/2002 |

\* cited by examiner

*Primary Examiner*—Dixomara Vargas
(74) *Attorney, Agent, or Firm*—Paul Vincent

(57) ABSTRACT

A magnetic resonance probe head (40) comprises a vacuum container (43) in which several RF resonator coils (31, 32; 51-54, 61-64) are disposed that can be cryogenically cooled and which are each designed as planar coils disposed parallel to a z direction. All of the RF resonator coils (31, 32; 51-54, 61-64) have a larger extension in an x direction (RSx) than in a y direction (RSy), wherein the x, y, z directions form a rectangular coordinate system. A central tube block (33; 81; 111; 121; 171; 181) is disposed between the RF resonator coils (31, 32; 51-54, 61-64) and has a recess (34, 112, 122) for a test sample (35), which is elongated in the z direction. The central tube block (33; 81; 111; 121; 171; 181) partially delimits the vacuum container and the recess (34, 112, 122) is disposed outside of the vacuum container (43). The central tube block (33; 81; 111; 121; 171; 181) has a larger extension in the x direction (ZRx) than in the y direction (ZRy) in the area between the RF resonator coils (31, 32; 51-54, 61-64). The inventive probe head improves the sensitivity, in particular, for small and round test samples.

31 Claims, 7 Drawing Sheets

VACUUM CONTAINER FOR COOLED MAGNETIC RESONANCE PROBE HEAD

This application claims Paris Convention priority of DE 10 2006 046 888.0 filed Oct. 4, 2006 the complete disclosure of which is hereby incorporated by reference.

BACKGROUND OF THE INVENTION

The invention concerns a magnetic resonance probe head, comprising
- a vacuum container in which several RF resonator coils are disposed, which can be cryogenically cooled and which are each designed as planar coils disposed parallel to a z direction, wherein the overall RF resonator coils have a longer extension in the x direction than in the y direction, the x, y, z directions forming a rectangular coordinate system,
- a central tube block disposed between the RF resonator coils and having a recess for a test sample, which is elongated in the z direction, wherein the central tube block partially delimits the vacuum container, and the recess is located outside of the vacuum container.

A magnetic resonance probe head of this type is disclosed e.g. in ref. [5].

Nuclear magnetic resonance (NMR) methods are used to analyze sample compositions or determine the structure of substances in samples. In these NMR methods, the sample is exposed to a strong static magnetic field $B_0$ in a z direction, and high-frequency electromagnetic pulses, which are orthogonal thereto, are irradiated into the sample in the x or y direction, causing an interaction with the nuclear spins of the sample material. The temporal development of these nuclear spins of the sample generates, in turn, high-frequency electromagnetic fields which are detected in the NMR apparatus. The detected radio frequency (RF) fields provide information about the properties of the sample.

The sensitivity of high-resolution NMR spectroscopy has been considerably increased in recent years by using cooled magnetic resonance probe heads. This is true, in particular, for high field NMR, i.e. NMR with static magnetic fields of more than 7 T, in particular, more than 11 T. The receiver coils and the receiver electronics of these probe heads are thereby cooled down to cryogenic temperatures (below 100 K). This reduces the thermal noise of resistive elements. Cooling also reduces the RF (radio frequency) resistance of metals leading to an increase of the Q value of RF resonator coils in the NMR probe head.

One constructive problem of cooled probe heads is the temperature control of the test sample which should generally be kept close to room temperature (−40 to 200° C., typically around 20° C.). Ref. [3] discloses a probe head, wherein a substantially circular cylindrical jacket-shaped RF resonator coil, which is to be cooled, is mounted to a cooled platform and is disposed in a vacuum container (also called a vacuum dewar). The vacuum dewar has a circular cylindrical recess which penetrates through the inside of the RF resonator coil and into which a test sample, e.g. a round test tube, which is filled with a sample substance to be investigated, is disposed. A ventilation gap (temperature control gap) remains between the wall of the test tube and the dewar wall of the recess. The ventilation gap adjusts a temperature control gas flow (e.g. air or nitrogen) that brings the test sample to a desired temperature. The test sample must thereby be carefully centered in order to prevent uneven heat input or irregular heat discharge. An insulation gap which prevents formation of a heat bridge remains between the dewar wall of the recess and the RF resonator coil. The dewar wall of the recess which surrounds the test sample is also called the central tube.

In addition to the Q value (i.e. the electric resistance) and the temperature of the receiver coil, the sensitivity of an NMR probe head also depends on the efficiency (field per unit current in the measuring volume) or the filling factor (useful energy in the measuring volume divided by the total energy). The larger the fraction of the measuring volume relative to the coil volume, the better is the efficiency/filling factor. Although the filling factor is a common value in literature, its quantitative use is problematic, since the behavior during scaling of the test sample is different from that during scaling of the coil. Since this value is very transparent, it is also used herein.

In particular, in the probe head of Ref. [3], the ventilation gap and the dewar wall thickness limit the achievable efficiency or filling factor. The dewar wall has a minimum thickness due to manufacturing and mechanical reasons, irrespective of the size of the recess or the size of the test sample. The temperature control gap must also have a minimum width in order to ensure sufficient temperature control gas flow, which is also substantially independent of the size of the test sample. In particular, for test samples having a small diameter (smaller than 5 mm), the ventilation gap and dewar wall occupy a considerable part of the coil volume, such that test samples having a small diameter only achieve a small efficiency/filling factor.

In order to compensate for the small efficiency/filling factor of small test samples, superconducting receiver coils of high-temperature superconducting material (HTS) are conventionally used. HTS receiver coils have a considerably higher Q value than comparable metal coils. However, HTS receiver coils for magnetic resonance probe heads can currently only be produced on planar substrates. These planar receiver coils project past the central tube transverse to the extension thereof, and therefore have a worse efficiency/filling factor than circular cylindrical jacket shaped coils. The poor efficiency/fill factor is, however, overcompensated for by the higher Q value of the planar HTS resonator coils.

Ref. [5] discloses a configuration with two parallel, opposite HTS RF resonator coils, between which a round central tube for a test sample with round test tube is disposed. The RF resonator coils are approximately 2.5 times wider than the central tube. The wall thickness of the dewar wall and the width of the air gap between the test sample and the dewar wall of this configuration also limit the separation between the two planar RF resonator coils and thereby the efficiency/filling factor.

In contrast thereto, it is the underlying purpose of the present invention to present a magnetic resonance probe head, which improves the sensitivity, in particular, for small and round test samples. This is important, in particular, for high-resolution and high-field NMR.

SUMMARY OF THE INVENTION

This object is achieved by a magnetic resonance probe head of the above-mentioned type which is characterized in that the central tube block has a larger extension in the x direction than in the y direction in the area between the RF resonator coils.

In accordance with prior art, the temperature of the test sample is reliably controlled by a temperature control gas flow, wherein the temperature control gas flows directly around the test sample from all sides (usually a round test tube filled with a sample substance to be investigated). The temperature control gas thereby flows through a ventilation gap which is annularly provided around the entire test sample. The ventilation gap represents part of the coil volume which cannot be filled by the test sample, and therefore always deteriorates the efficiency/filling factor.

In accordance with the invention, it has turned out that the annular ventilation gap is not required for controlling the temperature of the test sample. The temperature of the test sample can be completely or partially controlled via the central tube block or the wall of the central tube block that faces the test sample. The central tube block is thereby included in the thermal flow from or to the test sample. In accordance with the invention, the means of the central tube block that ensure thermal flow from or to the test sample, are disposed in the x direction on the side of the recess for the test sample in the central tube block. For this reason, in accordance with the invention, the extension of the central tube block in the x direction must be larger than in the y direction. The space that is not required as measuring volume, is sufficient for these means, since the overall RF resonator coils have a longer extension in the x direction than in the y direction.

The RF resonator coils can be moved more closely to the test sample, in particular in the y-direction, since the temperature control gap is omitted. This is accompanied by a reduction in coil volume (for a given measuring volume), which increases the efficiency/fill factor of the RF resonator coils. This improves the signal-to-noise ratio of the magnetic resonance probe head, and reduces the pulse times for the same pulse angle with equal power.

In the simplest case, the massive structure of the central tube itself constitutes the means of the central tube block that ensure thermal flow to or from the test sample. Additional central tube block material on the side of the recess improves thermal conduction (typically in the z direction) from the limited measuring region between the RF resonator coils. A heat sink or heat source (e.g. an electric heating means) can be disposed on the central tube block outside of the measuring region.

The means of the central tube block that ensure thermal flow to or from the test sample preferably comprise at least one coolant guidance or coolant line in the central tube block in the x direction on the side of the recess, wherein a coolant (typically a temperature-controlled gas such as air or nitrogen or also a temperature-controlled liquid like water) flows in the coolant guidance. The coolant controls the temperature of the central tube block and optionally also directly of part of the test sample. The temperature of the coolant is controlled outside of the central tube block by a heat sink or heat source (e.g. an electric heating means).

The central tube block in turn, controls the temperature of the test sample which is disposed in its recess, through direct (preferably laminar) contact and/or via thermal radiation. Temperature control via thermal radiation alone is often sufficient mainly for smaller test samples (sample diameter of 3 mm or less). The central tube block preferably completely surrounds the test sample in the xy plane, i.e. the recess is delimited on all sides by the central tube block in the xy plane. Typically, the recess is substantially cylindrical.

Since the central tube block is more massive in the x direction on the side of the recess, one can reduce the wall thickness of the central tube block in the y direction at the recess. Thus, the RF resonator coils can also be disposed more closely to the test sample in the y direction.

In accordance with the invention, the RF resonator coils are typically produced from superconducting material, preferably HTS, in order to obtain an optimum Q value. The RF resonator coils are generally disposed on flat substrates. Their resonance frequencies are generally in a range between 20 MHz and 1.5 GHz.

The central tube block has a ratio between the x extension and the y extension of typically 1.2 or more (and preferably 1.5 or more). The entire RF resonator coils typically also have a ratio between the x extension and y extension of 1.2 or more (and preferably 1.5 or more). The x direction and y direction generally extend along the main axes or symmetry axes of central tube block and the entire RF resonator coils. The x axis of a central tube block having an approximately rectangular cross-section in the xy plane extends e.g. parallel to the longer side edges and the y axis extends parallel to the shorter side edges.

A test sample disposed in the recess typically has the same (maximum) diameter in the x direction and y direction. The test sample is regularly elongated in the z direction in correspondence with the shape of the recess.

In one particularly preferred embodiment of the inventive magnetic resonance probe head, a test sample is disposed in the recess for a test sample, in particular, wherein the test sample has a circular cross-section relative to the xy plane.

In another preferred embodiment, the test sample has a maximum diameter of 3 mm or less in the xy plane. The efficiency gain of the RF resonators obtained by the invention is particularly noticeable in connection with such small sample diameters.

In a further development of this embodiment, the diameter of the test sample in the y direction is equal to the diameter of the recess in the y direction. The extension of the recess in the y direction within the entire RF resonators is then completely utilized, thereby obtaining a high filling factor. Edges of the test sample facing the RF resonator coils thereby typically abut the wall of the recess.

In another preferred embodiment of the inventive magnetic resonance probe head, two RF resonator coils are provided which are each designed as a planar coil in the xz plane, the two RF resonator coils being separated from each other in the y direction and opposite to each other. This construction is particularly simple, and the invention considerably reduces the separation between the RF resonator coils in the y direction. This embodiment typically comprises exactly the two above-mentioned RF resonator coils, wherein the x extension of the central tube block substantially corresponds to the x extension of the RF resonator coils.

In a further development of this embodiment, the central tube block comprises two flat outer surfaces that face the two RF resonator coils and are each disposed in an xz plane. This optimally fills the space between the RF resonator coils, in particular, by the central tube block.

In another preferred embodiment, the overall RF resonator coils are symmetrically disposed around the recess for the test sample, in particular, wherein the entire resonator coils are disposed mirror-symmetrically relative to an xz plane and/or mirror-symmetrically relative to an yz plane. The recess or test sample is then disposed in the center of the central tube block in a region of high magnetic field homogeneity.

Another preferred embodiment comprises four planar RF resonator coils having a cross-sectional shape relative to the xy plane of two "V"s whose open sides face each other. This configuration has a naturally high filling factor which can even be further increased by the invention.

In another advantageous embodiment, the outer cross-section of the central tube block is rounded relative to the vacuum container in the xy plane, in particular, wherein the outer cross-section is entirely or sectionally elliptical or oval. The recess can be sealed more easily relative to the vacuum container using O-rings, indium or copper rings and the like, since there are no edges, in particular, no rectangular edges.

In a particularly preferred embodiment, the central tube block consists of a material having a thermal conductivity $\geq 5$ W/(m*K), in particular sapphire, amorphous aluminum oxide, aluminum nitride, beryllium oxide, boron nitride, magnesium oxide or materials containing these substances, in particular, machinable ceramic materials, like Shapal. This improves the thermal flow from or to the test sample via the central tube block.

In a preferred embodiment, the central tube block has two half shells which are mounted, in particular glued, melted or soldered to each other in the xz plane. A central tube block of this type can be produced in a simple and inexpensive fashion.

In another advantageous embodiment, the central tube block has an electrically conducting coating. The coating can be used as an electric heating means. The central tube may also be coated, wherein the coating reflects thermal radiation, thereby reducing the thermal load on the central tube.

In another advantageous embodiment, the central tube block is surrounded by fibers which are not electrically conducting. The fibers form a super insulation using black body temperature radiation.

In one particularly preferred embodiment of the inventive magnetic resonance probe head, at least one coolant guidance is provided in the central block, a test sample is disposed in the recess for a test sample, the at least one coolant guidance extends in the area between the RF resonator coils on the side of the test sample relative to the x direction, and the at least one coolant guidance is located in the y direction entirely within the area of the y extension of the test sample in the area between the RF resonator coils. The coolant guidance realizes a particularly powerful heat supply or heat discharge. The required y extension of the central tube block is determined only by the test sample, since the coolant guidance is disposed on the side in the x direction, wherein the coolant guidance does not project past the test sample in the y direction. This provides a high filling factor.

In a preferred further development of this embodiment, the at least one coolant guidance has two guiding sections in the area between the RF resonator coils, which extend on both sides of the test sample relative to the x direction. Temperature control on both sides reduces the temperature gradients in the test sample, and a symmetrical structure of the central tube block can be easily realized.

In a further preferred development, the at least one coolant guidance has a plurality of successive guiding sections, in particular, at least four subsequent guiding sections, between which the direction of extension of the coolant guidance changes in each case. This further reduces the temperature gradients in the central tube block.

In a particularly preferred further development, the at least one coolant guidance is separate from the recess for the test sample with the result that the coolant flow in the coolant guidance can be easily controlled. The temperature of the test sample is then controlled only via the central tube block or the wall of the recess facing the test sample.

In a further development of this design, the recess for the test sample is designed as a flow cell, in particular, wherein the recess is directly filled with a flowable sample substance as test sample. A sample container for the test sample in the central block can then be omitted, thereby increasing the fraction of sample substance in the coil volume.

The flow cell is thereby preferably designed as a spheroid with an axis of rotation which is parallel to the z direction. This yields a homogeneous magnetic field of the test sample.

Moreover, the flow cell advantageously narrows towards its feed lines. The volume of the sample substance outside of the measuring region can thereby be reduced.

In a particularly preferred further development of the design, which comprises a separate coolant guidance, a test sample is disposed in the recess for a test sample, and the test sample comprises a sample container which is filled with a sample substance. This configuration has proven to be useful in practice and permits good and rapid handling of the test sample. The sample substance may be a liquid (which typically contains a solvent) or also a solid sample (typically a powder). The sample container is usually a round test tube.

The sample container preferably flatly abuts the entire wall of the recess of the central tube block or sections thereof at least in the area between the RF resonator coils. The contact improves heat transfer between the central tube block and the sample container (and thus of the sample substance). The sample container typically completely fills the recess. A corresponding design can also be used when the coolant guidances are not separate.

The recess is preferably designed as a continuous bore through the central tube block, the bore is closed at one end by a stopper, wherein the end of the stopper facing the sample container is curved parallel to the end of the sample container facing the stopper, and the magnetic susceptibility of the material of the stopper corresponds to the magnetic susceptibility of the test sample. This yields good magnetic field homogeneity in the sample substance.

The recess may alternatively be designed as a blind hole in the central tube block. This is simple to produce.

In a preferred further development of the embodiment, which has at least one coolant guidance, the recess for the test sample also comprises the at least one coolant guidance, a test sample being disposed in the recess for a test sample, the test sample comprising a sample container which contains a sample substance, wherein the sample container partially delimits the at least one coolant guidance. In this further development, the temperature of the test sample is partially directly controlled by passing coolant to improve thermal flow. The requirements for the thermal conductance of the central tube block are then reduced. The walls (e.g. for the coolant guidance) moreover require less space in the central tube block, thereby increasing the filling factor.

In a further development of this embodiment, centering elements and/or stop elements are provided in the recess, which position the sample container in the xy plane and/or in the z direction during insertion into the recess. This positioning ensures a homogeneous magnetic field in the test sample.

The centering elements and/or stop elements are thereby preferably produced from a material having a magnetic susceptibility that corresponds to the volume susceptibility of a coolant of the coolant guidance, in particular, wherein air of 0.4 ppm in SI units or nitrogen of −0.0064 ppm in SI units is provided in the coolant guidance. This prevents distortion of the static magnetic field by the centering and stop elements.

The centering elements may also be designed as continuous rods which extend in the z direction at least in the area of the RF field of the resonator coils. This also prevents magnetic field distortions.

In another further development, the central tube block has a wall cross-section of constant thickness relative to the xy plane at least in the area of the RF field of the resonator coils. The central tube block is then particularly easy to produce, in particular, using glass and plastic materials and casting and shaping methods.

In a further embodiment of an inventive magnetic resonance probe head, the recess for the test sample is substantially cylindrical, with the cylinder axis extending in the z direction, thereby providing high homogeneity of the magnetic field in the test sample.

The present invention also concerns an NMR (nuclear magnetic resonance) measuring apparatus, comprising a magnet system for generating a homogeneous static magnetic field $B_0$ in the z direction and an NMR spectrometer comprising an inventive magnetic resonance probe head. A measuring apparatus of this type produces very precise spectroscopic data about a test sample.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

The invention is shown and explained in more detail in the drawing.

DESCRIPTION OF THE PREFERRED EMBODIMENT

Figure 1:
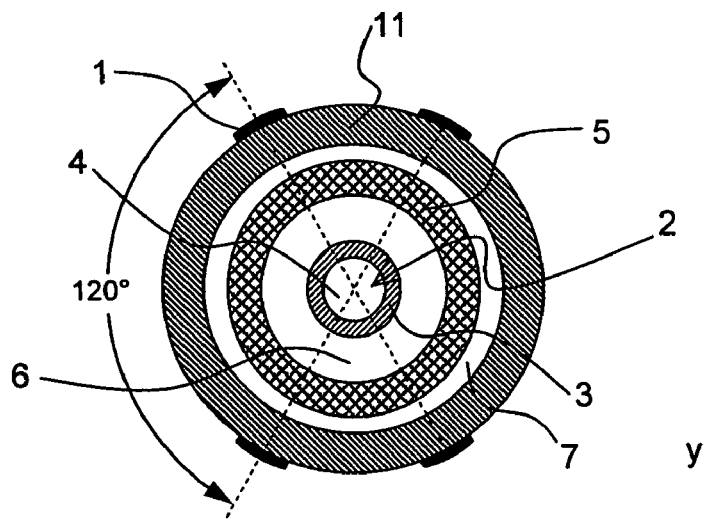
FIG. 1 shows a schematic cross-sectional view through a magnetic resonance (MR) probe head of prior art with a round RF resonator coil with circular central tube.

The invention concerns a vacuum container for a cooled magnetic resonance probe head.

The sensitivity of high-resolution nuclear magnetic resonance (NMR) spectroscopy and NMR microscopy has been substantially increased recently by using cooled magnetic resonance probe heads.

The receiver coils and the receiving electronics of these probe heads are usually cooled to cryogenic temperatures, i.e. temperatures below 100 K. Cooling reduces thermal noise of the resistive elements and also the RF resistance of metals. It moreover enables use of superconductors for the transmitting/receiver coils. Cooled electronics can be produced with a lower noise temperature than conventional electronics.

One of the major problems of cooled magnetic resonance probe heads is the requirement to achieve cryogenic temperatures for the transmitting/receiver coils and at the same time maintain the test samples close to room temperature (−40 to +200° C.), since the test substances (or test objects in microscopy) are generally dissolved in liquid solvents (water, acetone, methanol, chloroform, benzene, . . . ). The established cryotechnical solution is to either build a vacuum dewar and to surround the elements to be cooled with liquid or gaseous coolant (see Ref. [4a], FIG. 2b), or to mount the elements to be cooled to a cooled platform (cold finger) and isolate them in vacuum (see Ref. [3], FIG. 7). There are also particular embodiments of the second type, wherein the coolant flows directly inside the transmitting/receiver coils.

In the first case, two walls and an insulation vacuum separate the test sample from the receiver coil, in the second case, only one wall. Since the second solution requires much less space than the first solution, the second solution is generally preferred.

It must be noted that additional space is required in both cases (compared to room temperature probe heads). For thermalizing the test sample, it is generally heated (or cooled) using a gas flow. An annular temperature control gap is provided around the test sample for this gas flow. Free space (vacuum gap or insulation gap) is moreover required between the wall of the vacuum dewar and the receiver coil at least when a cold finger is used (in the first case of cooling with liquid or gaseous coolant, this insulation gap is integrated in the dewar wall).

Cooling using a gas flow is, however, problematic. Imprecise centering of the test sample and/or contact with the central tube generates temperature gradients which produce artifacts for some test substances with temperature-dependent couplings. On the other hand, the gas flow and thus the heating or cooling power is limited, since excessively high flow speeds cause vibrations or even lift the test sample. Configurations which limit these problems to a tolerable degree, are disclosed e.g. in Ref. [2], see in particular FIGS. 7a, 7b thereof.

The sensitivity of NMR probe heads does not only depend on the Q value (i.e. the electric resistance) and the temperature of the receiver coil, but also on their efficiency (field per unit current in the measuring volume) or filling factor (useful energy in the measuring volume divided by the overall energy). The efficiency is also called $\eta$ below. It is obvious that the efficiency/filling factor decreases with an increasing coil volume/measuring volume ratio.

When test samples having a circular cross-section and coils of the circular type are used, the sensitivity of the probe head, i.e. the achievable signal-to-noise ratio S/N behaves approximately like $R_S/R_C$, with $R_S$: radius of the test sample (s="sample") and $R_C$: radius of the coil (c="coil"), when all other parameters are kept constant. The fill factor behaves like $(R_S/R_C)^2$ under the condition that only $R_S$ is varied. The dependence is complicated when the dimensions of the coil are scaled (since in general. the Q value and the inductance L also change). For this reason, the filling factor is not a useful definition as a quantitative value. However, it is often used, since it is a very descriptive value. The efficiency $\eta$, however, behaves like $(R_S/R_C)^2$ during scaling of both the coil and the test sample.

For relatively large test samples such as e.g. the standard test tube of a diameter of 5 mm, the loss in efficiency/filling factor of cooled probe heads compared to room temperature probe heads is clearly compensated for by the gain in Q value and noise temperature. The smaller the diameter of the test samples used, the worse the ratio between $R_S$ and $R_C$, since neither the wall thickness of the vacuum container nor the width of the temperature control gap and vacuum gap can be reduced. The reasons for the more or less constant wall thicknesses are due to production and mechanics. The gap provided for the temperature control gas flow cannot be reduced, since the cold to be discharged per solid angle remains constant when the sample diameter is reduced.

FIG. 1 shows a schematic cross-sectional view of a conventional cryo probe head perpendicular to the z axis in which a strong static magnetic field $B_0$ is applied. The cryo probe head has an RF resonator coil 1 of substantially annular cross-section (the figure shows four conductor cross-sections thereof) which is disposed on a cylinder jacket-shaped substrate 11. A round test sample 2 is disposed radially inside the RF resonator coil 1, which comprises a sample container 3 and an inner area of the sample container 3, which is filled with a sample substance 4. A round wall 5 of uniform thickness of the vacuum container is disposed between the test sample 2 and the RF resonator coil 1, in which the RF resonator coil 1 is disposed. The wall 5 is also called the central tube. The vacuum container thermally insulates the RF resonator coil 1 which is cooled via a cold finger (not shown). An annular temperature control gap 6 in which a gas flows (in z direction perpendicular to the plane of the drawing) is disposed between the wall 5 and the test sample 2. The gas flow controls the temperature of the test sample 2. The gas flow also heats the wall 5, and for this reason there is an insulation gap 7 between the wall 5 and the RF resonator coil 1 or its substrate 11. This prevents formation of a heat bridge to the cooled RF resonator coil 1.

When the diameter of the test sample 2 decreases, the measuring volume decreases more than the coil volume can be reduced (see the cross-sectional inner surfaces of the test sample 2 and RF resonator coil 1), such that the efficiency $\eta_{cryo}$ decreases towards smaller sample diameters. However, the ratio between measuring volume and coil volume of room temperature (RT) probe heads remains almost the same even when the diameter of the test sample decreases, since an RF resonator coil can be moved directly to the test sample in the RT case.

Superconducting receiver coils made from HTS (high temperature superconductor) can be used in order to compensate for the extremely unfavorable filling factor of small test samples. These coils have a considerably higher Q value than comparable metal coils but are disadvantageous in that HTS having material parameters which are suited for use in magnetic resonance probe heads can currently only be produced on planar substrates. A round central tube which is adjusted to the test sample was conventionally also used for these probe heads (see Rf. [5], FIG. 1).

The use of planar substrates deteriorates the efficiency of the coils compared to coils of conventional cryo probe heads by a factor of typically 3-4 for a given sample diameter.

Figure 2:
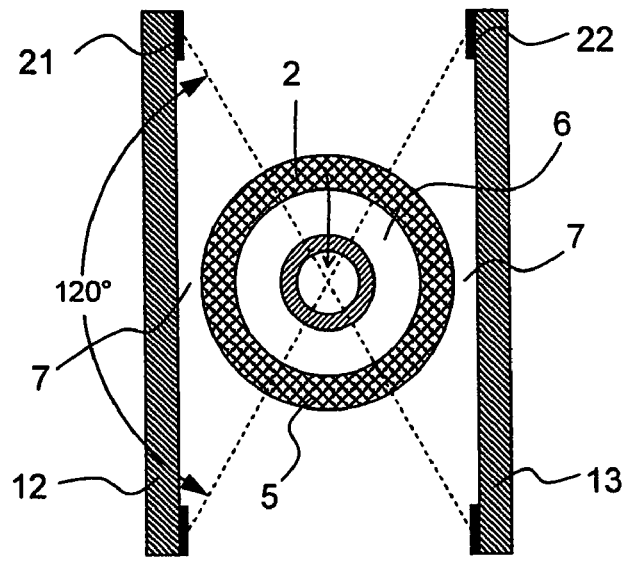
FIG. 2 shows a schematic cross-sectional view through a conventional MR probe head with planar RF resonator coils of HTS with circular central tube.

FIG. 2 shows a cross-sectional view perpendicular to the z axis of an HTS cryo probe head of prior art which is comparable to Ref. [5]. The vacuum container wall (the central tube) 5 extends between two planar HTS-RF resonator coils 21, 22 (the cross-section shows only two conductor cross-sections each which are disposed on planar substrates 12, 13), within which the test sample 2 is disposed. Also in this case, a temperature control gap 6 remains between the wall 5 and the test sample 2, and a gap between the planar RF resonator coils 21, 22 and the wall 5 can be taken as an insulation gap 7.

The measuring volume thereby decreases more than the coil volume with decreasing test sample 2 diameter (see the space within the test sample 2 and the space between the coils 21, 22). The coil volume is considerably larger than in FIG. 1, whereas the test samples 2 have the same size.

Planar HTS resonator coils nevertheless yield a considerable gain in probe head sensitivity for small test samples, since the thermal noise of the coils of an HTS probe head is approximately 15 to 20 times smaller than that of an equivalent RT probe head. As a result, HTS-RF resonator coils can increase the sensitivity of smaller test samples by a factor of 3 to 6 compared to RT-RF resonator coils.

The opening angle of 120°, as shown in FIG. 2, is not absolutely necessary. Sufficient field homogeneity in the sample volume can e.g. also be obtained with smaller opening angles, such that the HTS resonators may also have a narrower design.

The invention consists in increasing the filling factor of probe heads with planar HTS-RF resonator coils through constructive measures. This considerably increases the sensitivity of the probe head.

In summary, the invention increases the width of the central tube of a magnetic resonance probe head in a direction perpendicular to the $B_0$ field, the control tube housing the sample in an NMR measurement and separating the sample from the vacuum container. There is unused space in this direction inside the overall RF resonator coils of the probe head, in particular, since the RF resonator coils are disposed in this direction at a relatively long distance from the recess for the test sample in the central tube. The widened central tube is also called central tube block. The widening is used to house means for controlling the temperature of the test sample. The temperature of the test sample is controlled at least partially via the central tube block.

The invention typically provides for use of a vacuum container comprising first, an inner area having an outer and an inner cylindrical interface which extends parallel to the z axis and in the direction of the $B_0$ field, which are connected to each other at the top and bottom, thereby sealing the inner area, and second, an outer area AR which is disposed in the central area of the vacuum container and is surrounded by the cylindrical part of the inner interface, and third, at least one cryogenically cooled coil/resonator system which is disposed within the inner area and generates and/or receives a radio frequency field $B_1$ in the area $z_1<z<z_2$ in the outer area AR during the measuring process, and fourth, a test sample which is positioned in the outer area AR and is oriented parallel to the z axis, wherein the inner interface surrounds a cross-sectional surface which is oriented perpendicularly to the z axis at least in the area $z_1<z<z_2$, the orthogonal axes of which have different lengths, wherein the coil/resonator system is formed from planar elements, and wherein the test sample has a round cross-sectional shape.

In particular, when receiver coils are used which are based on planar substrates, it is not wise to use a circular-cylindrical central tube even when the test samples are circular cylindrical. In particular, when the test samples are small (1-3 mm), the filling factor of the coils can be considerably increased by using a flattened central tube (central tube block), wherein the unused space of the planar coils is used to ensure temperature control of the test samples and at the same time remove the "air gap" (temperature control gap) in the direction of the transmitting/receiver coil. For larger test samples, the difference is less, since the separation gained by omitting the temperature control gap is less important relative to the overall dimensions. Temperature control without regular gas flow is also increasingly difficult to realize with larger test samples.

Figure 3:
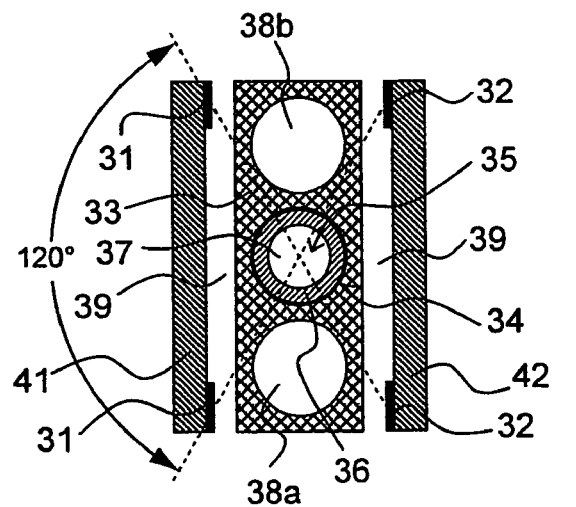
FIG. 3 shows a schematic cross-sectional view through an inventive MR probe head with planar RF resonator coils of HTS and a central tube block which is enlarged in the x direction.

FIG. 3 shows a cross-sectional view of an inventive probe head perpendicular to the z axis. A substantially cuboid central tube block 33 is disposed between two planar parallel RF resonator coils 31, 32 (which are disposed on planar substrates 41, 42). The central tube block 33 simultaneously delimits a vacuum container in which the RF resonator coils 31, 32 are disposed (further delimitations of the vacuum container are not shown, see also FIGS. 4a-4c). A circular cylindrical recess 34 is provided in the center of the central tube block 33, in which a test sample 35 is disposed. Each RF resonator coil 31, 32 spans an angular area of 120° about the center of the test sample 35 on each side of the test sample 35 in the xy plane.

The test sample 35 comprises a sample container 36 with an inner area in which a sample substance 37 is disposed. A coolant guidance is provided in the central tube block 33, of which two guiding sections 38a, 38b are shown in FIG. 3d. A coolant flows in the coolant guidance which controls the temperature of the central tube block 33. Temperature control of the central tube block 33 also controls the temperature of the test sample 35 which directly abuts the wall of the recess 34 (and thus the central tube block 33). A small insulation gap 39 remains between the central tube block 33 and the RF resonator coils 31, 32 for thermal insulation of the RF resonator coils 31, 32.

The entire RF resonator coils 31, 32 of the inventive probe heads can be designed more compact than for the probe heads of FIG. 2 for a given test sample size. In particular, the RF resonator coils 31, 32 of the inventive probe heads can be moved in the y direction closer to the test sample 33, since a temperature control gap is not required in accordance with the invention. The RF resonator coils 31, 32 may also be shorter in the x direction, thereby covering the same angle, which also reduces the coil volume.

Due to the more solid construction of the central tube block 33 in the direction of the large axis (in the embodiment of FIG. 3 parallel to the x direction), the minimum wall thickness for small probe diameters can be further reduced compared to cylindrical tubes without endangering the mechanical properties of the central tube block. The RF resonator coils 31, 32 can be moved closer towards the test sample in the y direction. This further improves the coil efficiency.

Analogous to prior art, the efficiency can be further increased when the opening angle of the planar resonators differs from, in particular is smaller than, 120°. This can, however, deteriorate the RF field homogeneity in the test sample, such that a suitable compromise must be found.

A further problem with small test samples is solved at the same time: In particular, test samples having a diameter of less than 3 mm have sample containers with extremely small wall thickness and are very fragile. For this reason, these test samples should preferably center themselves in the probe head and not be inserted by spinners, which is common practice for larger test samples. Fracture of the test samples can thereby be prevented. Due to the small weight of these test samples, it becomes more and more difficult with decreasing diameters to ensure uniform temperature control thereof by a gas flow, since the test samples have the tendency to float or at least vibrate in the gas flow, thereby producing artifacts in the measurement. When a spinner inserts the test sample, the weight multiplies, since the spinner has a considerably larger weight than the test samples. In this case, it is possible to realize sufficiently high gas flow speeds in order to prevent temperature gradients and floating of the test samples.

Temperature control and the test sample can be spatially separated from each other in the present invention, in particular, when the central tube block is produced from a material having a high thermal conductivity (aluminum oxide ($Al_2O_3$), aluminum nitride (AlN), beryllium oxide (BeO), boron nitride (BN), magnesium oxide (MgO) etc. or materials containing these substances, in particular, machinable ceramic materials such as Shapal). Instead of gas flow, a liquid having a considerably higher thermal capacity may also be used for controlling the temperature.

The central bore (recess) may either be designed as a blind hole or be closed by a stopper whose magnetic susceptibility may be adjusted to the test sample. When the central bore is continuous, merely guidances for the test tube may be mounted, which define its position in a lateral and horizontal direction. Alternatively, the test tube may be guided outside (above) the central tube and be positioned in height.

The temperature of the sample is controlled by heat contact and/or heat radiation. For smaller sample diameters (3 mm and smaller), the power deposited in the sample during the transmitting phase, even with high-loss test samples, is sufficiently small that temperature control through heat irradiation is sufficient. For larger test samples (>5 mm), the heating power irradiated into the test sample in the transmitting phase may become problematic, and additional temperature control using a gas flow may be required.

One problem of high-resolution NMR is that a temperature gradient in the test samples produces artifacts in the spectra (line broadening etc.). When the central tube block is produced from a material having high heat conductivity, this problem can be reduced to a minimum. Moreover, the artifacts in the spectra depend on the absolute temperature difference and not on the gradients. For small sample diameters, these absolute temperature deviations (at least the lateral ones) can be neglected.

When the coolant guidances are designed separately from the test sample, the coolant flow can be increased to also eliminate the temperature gradients in the z direction. It is thereby also useful to reverse the flow direction through several coolant guidances, which produces a uniform temperature of the central tube block in the z direction.

The temperature can be controlled and regulated by a thermometer, which can either be mounted to the central tube block close to the test sample, or which only measures the temperature of the coolant. In the second case, the thermometer may e.g. be mounted in the coolant flow outside of the measuring region. The heat source or sink (heating/cooling) required for temperature control can be mounted outside or within the vacuum container and can be controlled via the thermometer and a control, e.g. a PID control element.

Figure 4A:
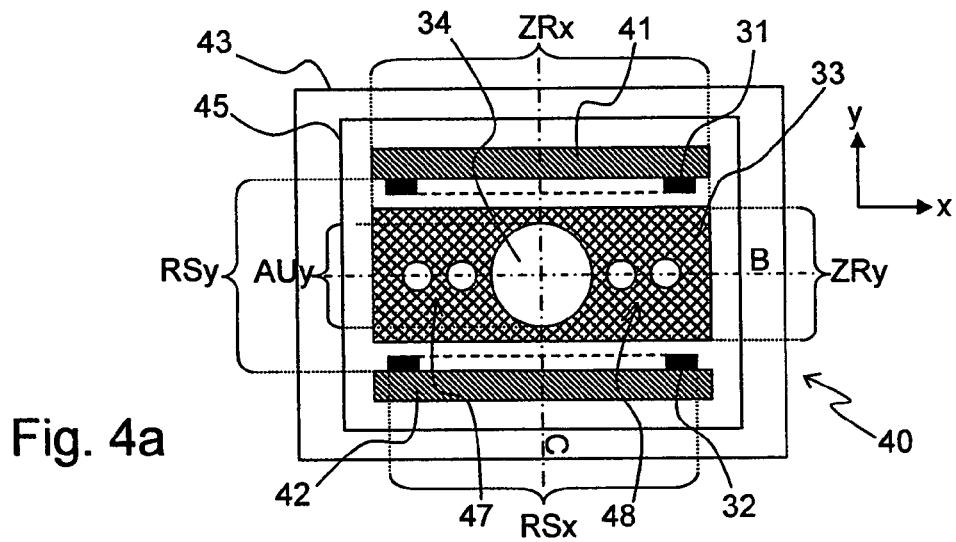
FIGS. 4a-4c show schematic cross-sectional views of a further inventive MR probe head.
Figure 4B:
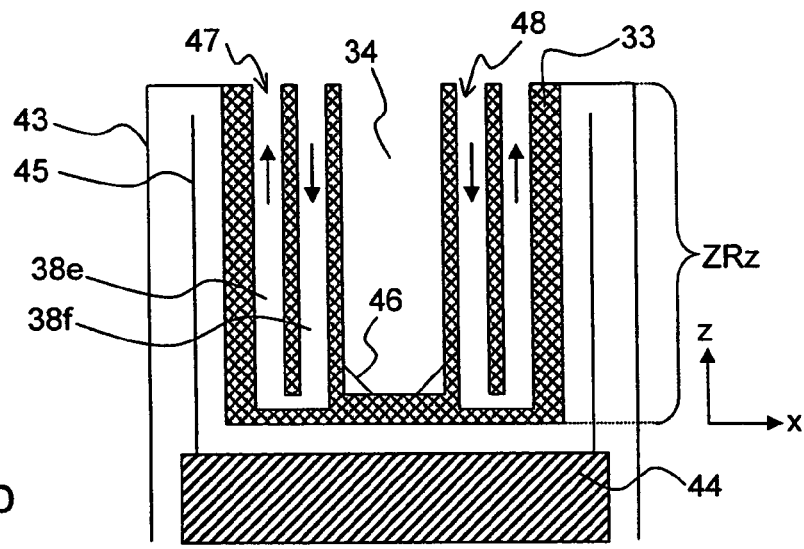
Figure 4C:
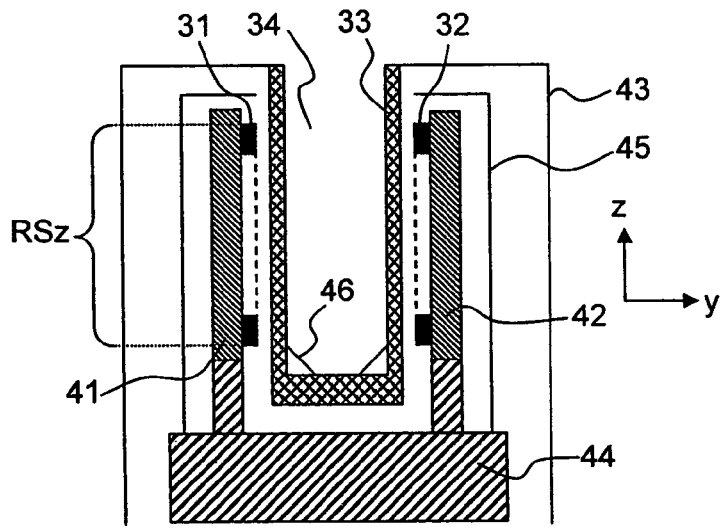

FIGS. 4a-4c show an inventive probe head 40 in different schematic sectional views. FIG. 4a shows a section through the xy plane, wherein a strong magnetic field $B_0$ is applied in the z direction in an NMR apparatus perpendicularly to the plane of the drawing. FIG. 4b shows a section along line B in FIG. 4a, and FIG. 4c shows a section along line C in FIG. 4a.

The probe head 40 has a vacuum container 43 in which two planar RF resonator coils 31, 32 of HTS material are disposed in a vacuum, which is schematically shown. The dashed lines show the further extension of conductor sections of the resonator coils 31, 32 above or below the plane of the drawing. The RF resonator coils 31, 32 are disposed on planar substrates 41, 42, which, in turn, are mounted to a cooled platform 44. The cooled platform cools the RF resonator coils 31, 32 to a temperature below the transition temperature of the HTS material. A radiation shield 45 reduces input of heat radiation onto the RF resonator coils 31, 32 and the planar substrates 41, 42.

The overall RF resonator coils 31, 32 have an extension RSx in the x direction, an extension RSy in the y direction, and an extension RSz in the z direction. These extensions also determine a coil space or space between the RF resonator coils 31, 32. RSx is thereby considerably larger than RSy.

A central tube block 33 delimits the center of the vacuum container 43. The central tube block 33 has a recess 34 into which the test sample (not shown) can be inserted. The outer diameter of the test sample typically corresponds to the diameter of the recess 34, such that the test sample abuts the recess 34. Centering elements 46 are provided in the recess 34, which automatically align the test sample. In an alternative embodiment (not shown), the recess may be designed such that it penetrates the entire probe head from the top to the bottom like a tube.

The central tube block 33 extends in the x, y and z directions by ZRx, ZRy, ZRz. ZRx is thereby considerably larger than ZRy. This shape, which is elongated in the x direction, forms coolant guidances 47, 48 in the central tube block 33 in the x direction on the side of the recess 34, without thereby requiring a larger separation between the two RF resonator coils 31, 32. This is ensured, in particular, in that the coolant guidances 47, 48 extend in the y direction completely within the y extension AUy of the recess 34. AUy thereby corresponds to the y extension of a test sample (not shown) which abuts the recess 34. A coolant flows through the coolant guidances 47, 48 during the measuring operation (see arrows in FIG. 4b) to control the temperature of the central tube block 33. The central tube block 33, in turn, controls the temperature of a test sample disposed in the recess 34. The coolant guidances 47, 48 thereby comprise several guiding sections (e.g. 38e, 38f) between which the flow direction of the coolant changes.

Figure 5:
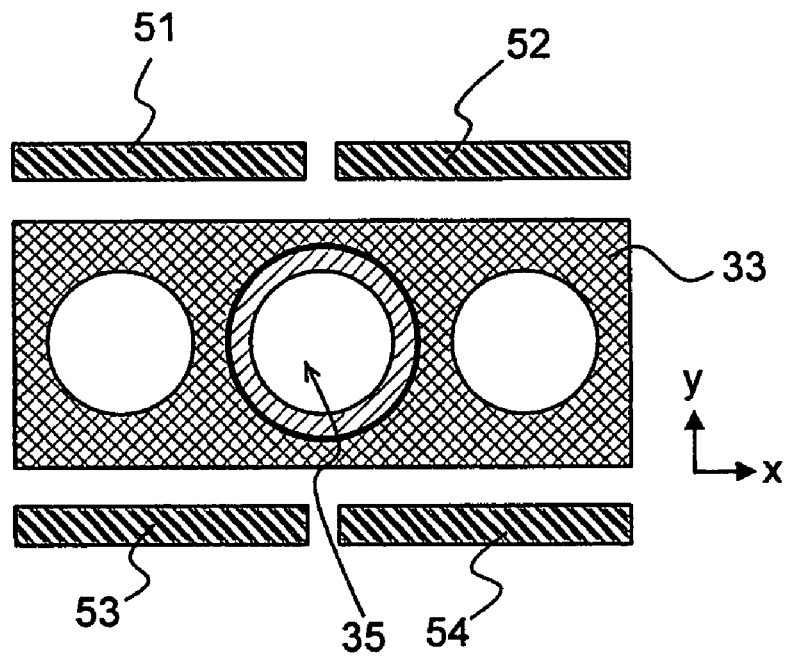
FIG. 5 shows a schematic cross-sectional view of a further inventive MR probe head with four planar RF resonator coils, respective pairs of which are disposed next to each other and on one side of the central tube block.

FIG. 5 shows a schematic cross-section of an inventive magnetic resonance probe head in the xy plane, wherein a total of four planar RF resonator coils 51, 52, 53, 54 are disposed around a central tube block 33. All RF resonator coils 51-54 are thereby disposed parallel to an xz plane. The rest of the vacuum container is not shown for reasons of simplicity.

Figure 6:
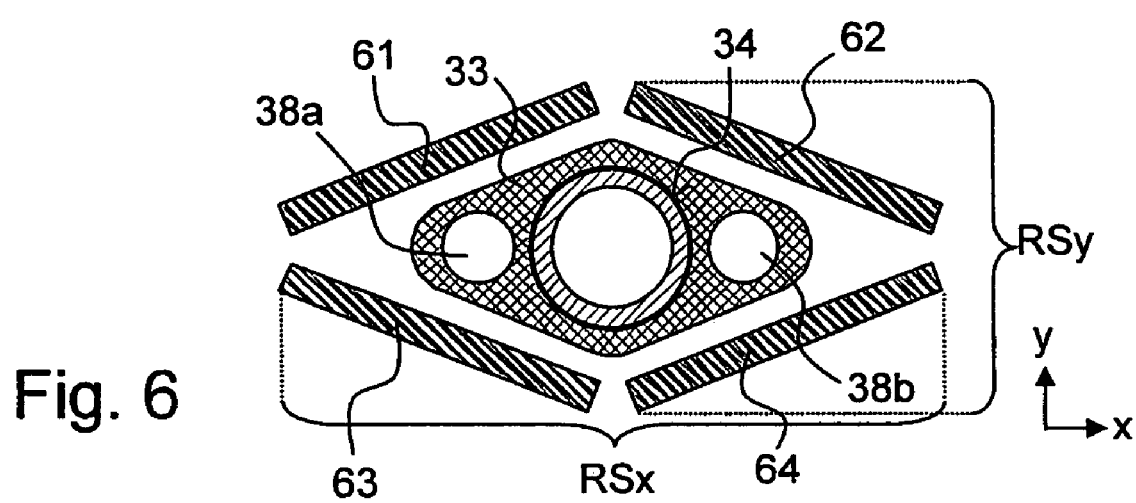
FIG. 6 shows a schematic cross-sectional view of a further inventive MR probe head with four planar RF resonator coils which are disposed in a diamond shape, as viewed in cross-section.

FIG. 6 also shows a schematic cross-sectional view of an inventive NMR probe head with four planar RF resonator coils 61-64, wherein the coils 61 and 63 form a V which is open towards the central tube block 33, like the coils 62 and 64. RSx is considerably larger than Rsy and, for a round test sample with a small diameter in the x and y direction, there is enough space left on the left and right side (next to, as viewed in the x direction) of the recess 34 for coolant guidances or their guiding elements 38a, 38b.

Further forms of central tube blocks that can be used within the scope of the invention are explained below.

Figure 7:
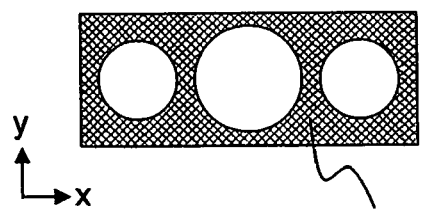
FIG. 7 shows a schematic cross-sectional view of a central tube block of the invention, having a rectangular cross-section.

The simplest embodiment of a central tube block 33 consists of a cuboid piece of dielectric material with high heat conductivity (e.g. sapphire, amorphous aluminum oxide, aluminum nitride, beryllium oxide, boron nitride, magnesium oxide, Shapal, . . . ), which is provided with three holes, wherein the central hole receives the test sample and the lateral holes are used for temperature control, (see central tube block 33 in FIG. 7). The dielectric material should have minimum RF loss (electric conductivity $\sigma<10^{-5}$ S/m, in particular, possibly $<10^{-8}$ S/m and a loss factor $\tan\delta<10^{-3}$, in particular if possible $<10^{-5}$) such that the RF loss of the central tube block does not reduce the sensitivity of the probe head.

Figure 8:
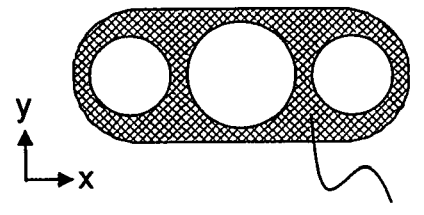
FIG. 8 shows a schematic cross-sectional view of a further central tube block of the invention with rounded outer cross-section.

When the central tube block does not have a rectangular cross-section, but, at least in sections, an oval or elliptical cross-section, (see central tube block 81 in FIG. 8), vacuum sealing can be realized much more easily e.g. using an O-ring, indium, etc.

Figure 9:
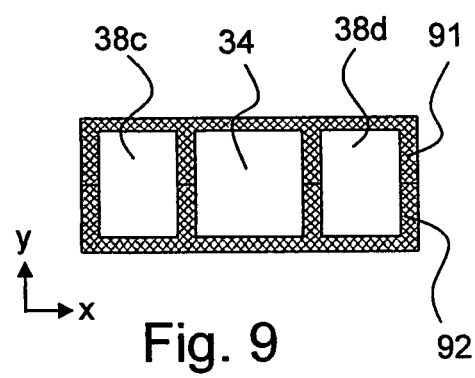
FIG. 9 shows a schematic cross-sectional view of a further central tube block of the invention which is produced from two half shells and has a recess of square cross-sectional shape for a test sample, and rectangular coolant guidances.
Figure 10:
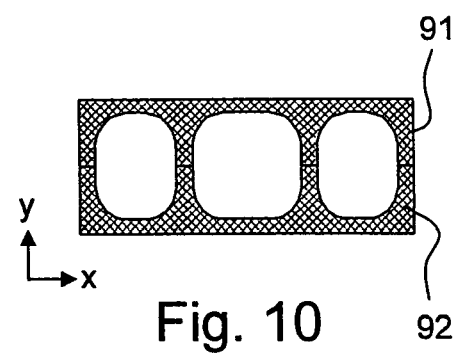
FIG. 10 shows a schematic cross-sectional view of a further central tube block of the invention, produced from two half shells, with rounded bores.

The central tube block can also be produced from two plates or half shells 91, 92, into each of which three (or more) grooves are milled/polished for a recess 34 and guiding sections 38c, 38d of a coolant guidance (see FIGS. 9 and 10). The two plates 91, 92 can subsequently be glued/soldered. Inorganic adhesives and glass solder are thereby suitable, in particular, when the NMR probe head is to be used for detecting protons and carbon signals. In order to prevent disturbances of the static magnetic field by inhomogeneous application of adhesive, an adhesive joint is preferably provided and the excess material is ground off after gluing/soldering. The central tube block may also be assembled from plates and cuboids. This method, however, is disadvantageous in that there are many more connecting locations that must be sealed in a vacuum tight fashion and not disturb the static field. The grooves may also be etched and not polished. This is particularly suitable when glass is used. Glass plates can subsequently be melted together by application of pressure and temperature without using adhesive.

However, the thermal conductivity of glass is relatively small. When this material is used, additional temperature control by a gas flow is therefore desirable.

Figure 11:
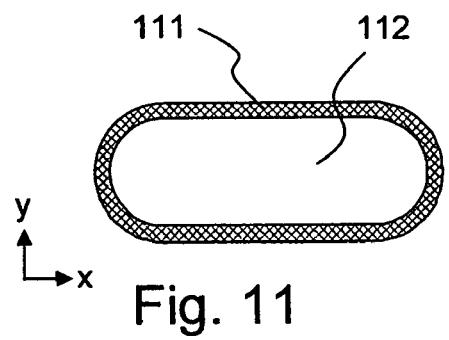
FIG. 11 shows a schematic cross-sectional view of a further central tube block of the invention, comprising a common recess for the test sample and coolant guidances, with a rounded outer cross-section and constant wall thickness.
Figure 12:
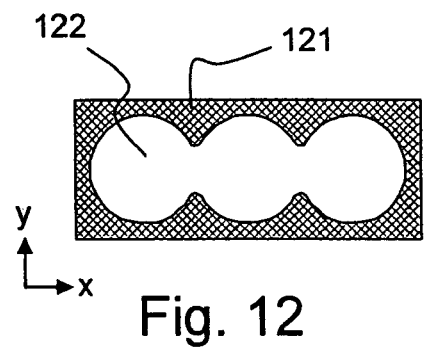
FIG. 12 shows a schematic cross-sectional view of a further central tube block of the invention, comprising a common recess for the test sample and coolant guidances in the form of overlapping, round bores.

In another embodiment, wherein the sample is not separated from the temperature control gas, the central tube block 111 is oval/elliptical with a substantially constant wall thickness (see FIG. 11) or the holes in the central tube block 121 are disposed to partially overlap (FIG. 12). The first form can be produced in a particularly easy fashion from shapeable materials such as glass or plastic material, the second can also be ground from hard materials. The advantage of the second embodiment consists in that the test tube is both guided and centered and the temperature is controlled by heat guidance, radiation and a gas flow. The recess 112 or 122 comprises space for the test sample and the coolant guidance. These embodiments are disadvantageous in that the test samples may float in response to the gas flow.

When the oval embodiment of FIG. 11 is used, a guidance and stop for the test tube are required. It may include a displacement element 131 which keeps the impact pressure of the gas away from the sample container (test tube) 132 (see FIG. 13a, 13b) and also guidances 133, 141 which center the test tube 132 (see also FIG. 14a, 14b). FIGS. 13b, 14b each show the cross-section along line B in FIG. 13a, 14a. The displacement element 131 may be designed such that it largely reproduces the susceptibility of the test tube 132 (filled with an established or used solvent, e.g. water). This limits the magnetic disturbances caused by the transition of the susceptibility at the end of the test tube 132. The displacement element 131 may either be mounted directly to the central tube block 111 or be guided downwards using an extension 142 to be mounted (FIG. 14a). The guidances 133 are preferably produced from a material having a small spring force, and a magnetic susceptibility that is adjusted to the ambient medium (air, nitrogen, . . . ) in order to prevent disturbances of the static magnetic field. The guidances 141 may alternatively also be designed as continuous bars and be considerably longer than the height of the measuring volume (height in the z direction). This renders the requirements for the susceptibility of the material superfluous.

The gas flow may also flow from the top and not from the bottom, such that the test tube cannot be blown out of the probe head by the gas flow, but is pressed against the stop.

Figure 13A:
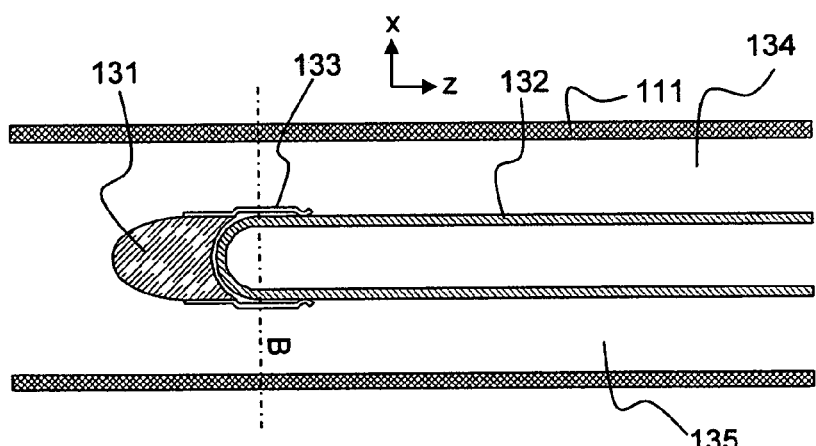
FIGS. 13a-13b show schematic cross-sectional views of a further central tube block of the invention, having a constant wall thickness, and centering means and displacement elements.
Figure 13B:
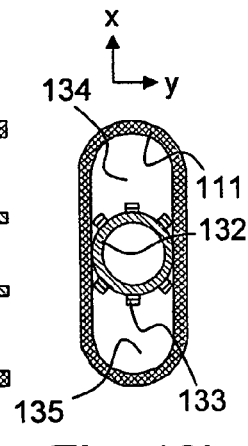
Figure 14A:
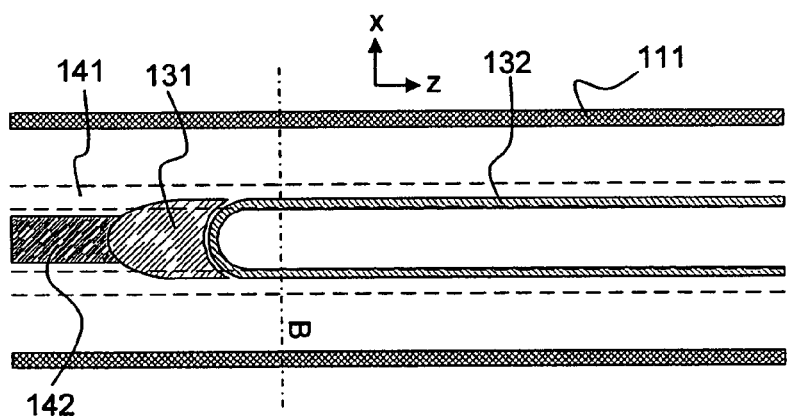
FIGS. 14a-14b show schematic cross-sectional views of a further central tube block of the invention, having a constant wall thickness, and guiding bars and extension.
Figure 14B:
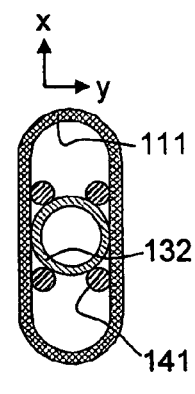

It should be noted that in the embodiment of FIGS. 13a, 13b, the coolant guidances 134, 135 are also directly delimited by the sample container 132.

Figures 15A, 15B, 15C:
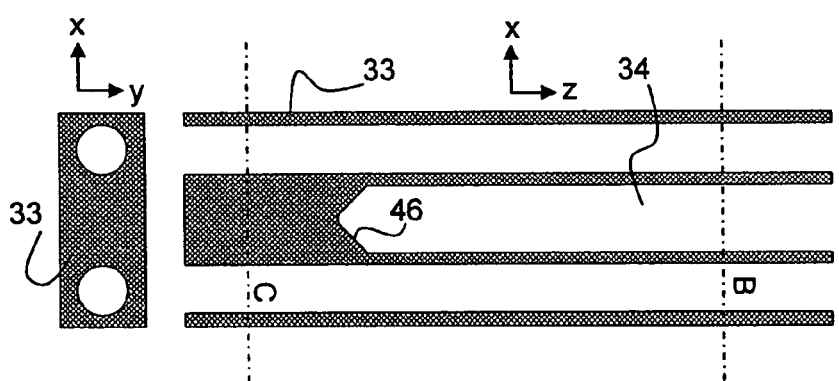
FIGS. 15a-15c show schematic cross-sectional views of a further central tube block of the invention, with a blind hole.

The central bore (recess) can be closed by a stopper or be designed as a blind hole. The test tube is thereby positioned in height. FIG. 15a shows a central tube block 33 with a recess 34 designed as a blind hole. FIGS. 15b and 15c each show the cross-section along the lines B and C of FIG. 15a.

Figures 16A, 16B, 16C:
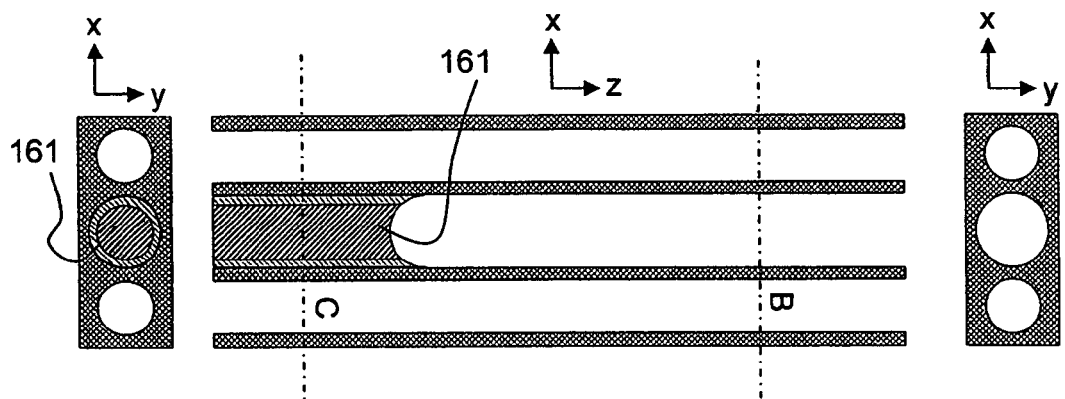
FIGS. 16a-16c show schematic cross-sectional views of a further central tube block of the invention, with continuous bore and susceptibility-adjusted stopper.

When a stopper 161 is used (FIG. 16a), it may be produced from a material having a susceptibility which is close to that of the test tube (not shown) with a common solvent. Disturbance of the static magnetic field at the end of the test sample can thereby be reduced. This also helps to reduce the fill level of the test sample which is required for shimming. The stopper 161 may also be designed in two or more parts, such that the test tube and the sample substance are separately "magnetically prolonged". This results only in disturbance by the presence of the bottom of the test tube. FIGS. 16b and 16c each show the cross-section along the lines B and C in FIG. 16a.

In order to compensate for the susceptibility of the stopper 161, the stopper may also be produced from a material having a higher susceptibility than the measuring substance (e.g. glass) and have a bore which is designed to approach the global susceptibility of the test sample.

Figure 17:
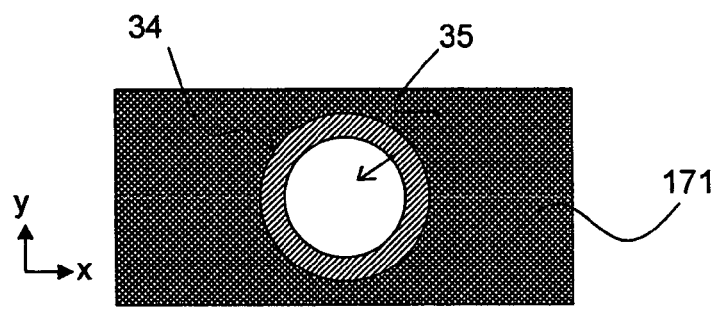
FIG. 17 shows a schematic cross-sectional view of a central tube block of the invention, which is solid without coolant guidance.

It is also possible to provide the central tube block 171 only with the bore (recess 34) for receiving the test sample 35 and make the rest preferably solid (see FIG. 17). In this case, temperature control can be performed using an electric heating means which is mounted below and/or above the measuring area on the central tube block 171. The additional material in the x direction, which reduces the temperature gradient over the measuring region, laterally improves the heat conduction of the central tube block 171. This solution does not offer active cooling of the test sample 35. The heat radiation to the transmitting/receiving coils (not shown) which surround the central tube block 171 must be used for cooling. This slows down the regulation times and the adjustable temperature range is limited.

In accordance with the invention, a liquid flow may be used instead of a gas flow for controlling the temperature. It is thereby important that the liquid has little electromagnetic loss. It must not contain any nuclei that could generate interfering NMR signals. In particular $^1H$, $^2H$, $^{13}C$, $^{15}N$, $^{19}F$ and $^{31}P$ are important measuring nuclei in high-resolution NMR spectroscopy, as well as other nuclei with a spin not equal to zero and a gyromagnetic ratio $\gamma$ in the range of $10^7$ rad $T^{-1}s^{-1} \leq \gamma \leq 3 \cdot 10^8$ rad $T^{-1}s^{-1}$. The dielectricity constant should also be minimum, such that the resonance frequency of the resonators preferably hardly changes in case of density fluctuations. For this reason, non-polar solvents are better suited than polar solvents. In particular, water has large losses at radio frequencies, such that it is preferably only used when it is shielded from the electric field of the coil. In an improved fashion, the coolant is also shielded from the magnetic field, except when e.g. deuterated solvents or fluorinated or chlorinated solvents are used. In this case, the temperature control liquid can also be used as an external lock substance.

When several bores are used in the central tube block, the gas/liquid flow may also change direction once or several times instead of flowing in a straight line through a coolant guidance, thereby reducing the temperature gradients in the z direction of the test sample.

Figures 18A, 18B, 18C:
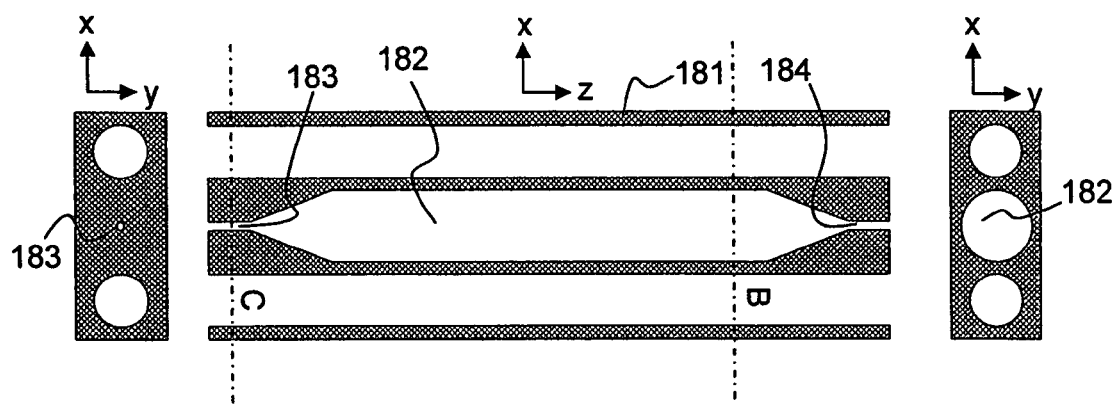
FIGS. 18a-18c show schematic cross-sectional views of a further central tube block of the invention, with a recess which is designed as a cylindrical flow cell.

The central tube block 181 may also be designed to contain a flow cell 182 as a recess, i.e. the sample liquid is filled directly into a chamber of the central tube block 181 using an inlet and outlet 183, 184 (FIG. 18a). FIGS. 18b and 18c each show the cross-section along the lines B and C in FIG. 18a. The inlet and the outlet 183, 184 are usually formed such that no bubbles are generated. Towards this end, it may be required to use additional flow elements which influence the flow of the sample liquid. The supply and discharge 183, 184 is usually designed to have a minimum diameter. This reduces the volume of the liquid outside of the measuring volume.

Figure 19:
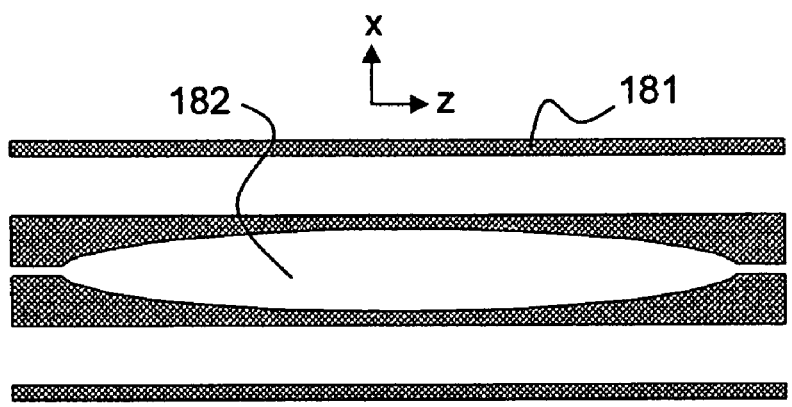
FIG. 19 shows a schematic cross-sectional view of a further central tube block of the invention, with a recess which is designed as a spheroidal flow cell.
Figure 20:
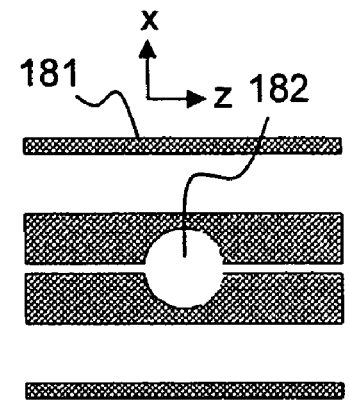
FIG. 20 shows a schematic cross-sectional view of a further central tube block of the invention, with a recess designed as spherical flow cell.

The measuring volume, i.e. the flow cell 182 can have any cross-sectional and longitudinal sectional shape. Particularly suitable shapes are spheroids, such as a sphere (see FIG. 20), ellipsoid (FIG. 19) or infinitely long cylinders with circular, elliptical, oval or rectangular cross-sections. Infinitely long means in this case, that the RF field of the measuring head at the end of the cylinder should have dropped down to $\frac{1}{10}$, better $\frac{1}{100}$ of its maximum strength in the measuring volume.

In accordance with the invention, the central tube block may be coated with a layer which reflects the heat radiation to reduce the heat load. The layer may be structured to improve its high-frequency properties. Fibers of the design of Ref. [2] may alternatively also be mounted. When the layer is electrically conducting, it can also be used as electrical heating means for the central tube block.

REFERENCES

[1] Kunihiko U.S. Pat. No. 3,525,928 (A)
[2] Marek: DE 10 006 324
[3] Marek: U.S. Pat. No. 5,247,256
[4a] Black and Roemer: U.S. Pat. No. 5,258,710
[4b] Kotsubo and Black: U.S. Pat. No. 5,508,613
[5] Withers: U.S. Pat. No. 5,585,723
[6] Hofmann et al.: U.S. Pat. No. 6,838,880 (B2)
[7] Hasegawa et al.: U.S. Pat. No. 6,914,430
[8] Swiet: US 2005 077 900

I claim:

1. A magnetic resonance probe head, the probe head having dimensions defined in x, y, z directions of a rectangular coordinate system, the probe head for investigation of a test sample or of a test sample having a circular cross section in an xy plane, the sample being elongated in the z direction, the probe head comprising:
a vacuum container;
several RF resonator coils disposed in said vacuum container, said coils structured for cryogenic cooling and each being designed as a planar coil which is disposed parallel to the z direction, wherein all of said RF resonator coils have a larger extension in the x direction than in the y direction; and
a central tube block disposed between said RF resonator coils, said central tube block having a test sample recess which is elongated in the z direction, wherein said central tube block partially delimits said vacuum container, said recess being outside of said vacuum container, said central tube block having a larger extension in the x direction than in the y direction in an area thereof disposed between said RF resonator coils.

2. The magnetic resonance probe head of claim 1, wherein the test sample is disposed in said recess.

3. The magnetic resonance probe head of claim 2, wherein a diameter of the test sample in the y direction is equal to diameter of said recess in the y direction.

4. The magnetic resonance probe head of claim 1, wherein the test sample has a maximum diameter of 3 mm or less in the xy plane.

5. The magnetic resonance probe head of claim 1, wherein two RF resonator coils are provided, which are each designed as a planar coil in an xz plane, said two RF resonator coils being separated from each other in the y direction and disposed opposite to each other.

6. The magnetic resonance probe head of claim 5, wherein said central tube block has two flat outer surfaces that face said two RF resonator coils and which are each disposed in an xz plane.

7. The magnetic resonance probe head of claim 1, wherein all RF resonator coils are disposed symmetrically around said recess or all RF resonator coils are disposed mirror-symmetrically relative to an xz plane, and/or mirror-symmetrically relative to a yz plane.

8. The magnetic resonance probe head of claim 1, wherein four planar RF resonator coils are provided, having a cross-sectional shape relative to an xy plane of two "V"s with open sides thereof facing each other.

9. The magnetic resonance probe head of claim 1, wherein, in an xy plane, said central tube block has a completely or sectionally rounded, elliptical, or oval outer cross-section towards said vacuum container.

10. The magnetic resonance probe head of claim 1, wherein said central tube block comprises a material having a heat conductivity $\geqq 5$ W/(m*K), sapphire, amorphous aluminum oxide, aluminum nitride, boron nitride, beryllium oxide, magnesium oxide, machinable ceramic material, or Shapal.

11. The magnetic resonance probe head of claim 1, wherein said central tube block has two half shells comprising grooves and being mounted, glued, melted or soldered to each other in an xz plane.

12. The magnetic resonance probe head of claim 1, wherein said central tube block has an electrically conducting coating.

13. The magnetic resonance probe head of claim 1, wherein said central tube block is surrounded by electrically non-conducting fibers.

14. The magnetic resonance probe head of claim 1, wherein said central tube block has at least one coolant guidance, the test sample being disposed in said recess, wherein said at least one coolant guidance extends in an area between said RF resonator coils on a side of the test sample relative to the x direction, and said at least one coolant guidance) is located, in the y direction, completely within an area of y extension of the test sample in an area between said RF resonator coils.

15. The magnetic resonance probe head of claim 14, wherein at least one said coolant guidance has two guiding sections in an area of said RF resonator coils, which extend on both sides of the test sample relative to the x direction.

16. The magnetic resonance probe head of claim 14, wherein at least one said coolant guidance comprises a plurality of successive guiding sections or at least four successive guiding sections, between which a respective direction of extension of said coolant guidance changes.

17. The magnetic resonance probe head of claim 14, wherein at least one said coolant guidance is separate from said recess.

18. The magnetic resonance probe head of claim 17, wherein said recess is designed as a flow cell or is directly filled with a flowable sample substance as the test sample.

19. The magnetic resonance probe head of claim 18, wherein said flow cell is designed as a spheroid with an axis of rotation extending parallel to the z direction.

20. The magnetic resonance probe head of claim 18, wherein said flow cell narrows towards feed lines thereof.

21. The magnetic resonance probe head of claim 17, wherein the test sample is provided in said recess, the test sample comprising a sample container which is filled with sample substance.

22. The magnetic resonance probe head of claim 21, wherein either sections of the sample container or the entire sample container abuts flatly on a wall of said recess of said central tube block at least in an area between said RF resonator coils.

23. The magnetic resonance probe head of claim 21, wherein said recess is designed as a continuous bore through said central tube block, one end of said bore being closed by a stopper, wherein an end of said stopper facing the sample container is curved parallel to an end of the sample container facing said stopper, a magnetic susceptibility of material of said stopper corresponding to a magnetic susceptibility of the test sample.

24. The magnetic resonance probe head of claim 21, wherein said recess is designed as a blind hole in said central tube block.

25. The magnetic resonance probe head of claim 21, wherein said recess is designed substantially cylindrical, with the cylinder axis extending in the z direction.

26. The magnetic resonance probe head of claim 14, wherein said recess also has at least one coolant guidance, the test sample being disposed in the recess, wherein the test sample comprises a sample container containing a sample substance, and the sample container partially delimits the at least one coolant guidance.

27. The magnetic resonance probe head of claim 26, wherein centering elements and/or stop elements are provided in said recess to position the sample container in the xy plane and/or in the z direction during insertion into said recess.

28. The magnetic resonance probe head of claim 27, wherein said centering elements and/or stop elements are produced from a material having a magnetic susceptibility that corresponds to a volume susceptibility of a coolant of said coolant guidance, of air with 0.4 ppm in SI units, or of nitrogen with −0.0064 ppm in SI units.

29. The magnetic resonance probe head of claim 27, wherein said centering elements are designed as continuous bars extending in the z direction at least in an area of an RF field of said RF resonator coils.

30. The magnetic resonance probe head of claim 26, wherein said central tube block has a constant cross-sectional wall thickness relative to the xy plane, at least in an area of an RF field of said RF resonator coils.

31. An NMR (nuclear magnetic resonance) measuring apparatus, comprising a magnet system for generating a homogeneous static magnetic field $B_0$ in the z direction and an NMR spectrometer comprising the magnetic resonance probe head of claim 1.

* * * * *